US011501048B1

(12) United States Patent
Saha et al.

(10) Patent No.: US 11,501,048 B1
(45) Date of Patent: Nov. 15, 2022

(54) ESTIMATING HARDNESS OF FORMAL PROPERTIES USING ON-THE-FLY MACHINE LEARNING

(71) Applicant: Synopsys, Inc., Mountain View, CA (US)

(72) Inventors: Arunava Saha, Sunnyvale, CA (US); Chuan Jiang, Ames, IA (US); Manish Pandey, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 1079 days.

(21) Appl. No.: 16/034,286

(22) Filed: Jul. 12, 2018

Related U.S. Application Data (60) Provisional application No. 62/543,112, filed on Aug. 9, 2017.

(51) Int. Cl.
    *G06F 30/3323*      (2020.01)
    *G06N 20/00*      (2019.01)
    *G06F 30/327*      (2020.01)

(52) U.S. Cl.
    CPC ........ *G06F 30/3323* (2020.01); *G06F 30/327* (2020.01); *G06N 20/00* (2019.01)

(58) Field of Classification Search
    CPC .... G06F 30/3323; G06F 30/327; G06N 20/00
    See application file for complete search history.

(56) References Cited

U.S. PATENT DOCUMENTS

| | | | |
|---|---|---|---|
| 7,458,046 B2 | 11/2008 | Ghosh et al. | |
| 7,788,556 B2 | 8/2010 | Jain et al. | |
| 2013/0019216 A1* | 1/2013 | Vasudevan | G06F 30/3323 716/106 |
| 2014/0330758 A1* | 11/2014 | Yu | G06N 5/02 706/57 |
| 2015/0213167 A1 | 7/2015 | Jain et al. | |

OTHER PUBLICATIONS

U.S. Appl. No. 62/425,064, filed Nov. 21, 2016, Inventors: Jinqing Yu et al. [Copy Not Enclosed].

\* cited by examiner

*Primary Examiner* — Nha T Nguyen
(74) *Attorney, Agent, or Firm* — Fenwick & West LLP (57) ABSTRACT

A machine learning model predicts the hardness of unsolved properties. For example, the machine learning model may predict the relative hardness of pairs of properties—i.e., which property in the pair is harder to solve. These hardness predictions may then be used to formulate a priority order for a formal verification process to attempt to solve the unsolved properties. As the formal verification process progresses, it generates results. For example, certain properties may be solved. These results are used to update a training set, which is used to further train the machine learning model. The machine learning model is trained at runtime with incremental fine-tuning as the formal verification process progresses.

20 Claims, 6 Drawing Sheets

| Feature | Description |
|---|---|
| OrigNumVars | Number of variables in original CNF formula before any unrolling during Bounded Model Checking |
| OrigNumClauses | Number of clauses in original CNF formula before any unrolling during Bounded Model Checking |
| nVars | Number of variables in CNF formula after certain cycles of unrolling during Bounded Model Checking |
| nClauses | Number of clauses in CNF formula after certain cycles of unrolling during Bounded Model Checking |
| varClauseRatio | Ratio between nVars and nClauses |
| decisionCount | Number of decisions in SAT solvers |
| conflictCount | Number of conflicts in SAT solvers |
| nBadStates | Number of states which can reach to any bad state after one transition |
| nProofObl | Number of proof obligations |
| lClauseVarRatio | Ratio between number of learnt clauses and nVars |

ESTIMATING HARDNESS OF FORMAL PROPERTIES USING ON-THE-FLY MACHINE LEARNING

CROSS-REFERENCE TO RELATED APPLICATION(S)

This application claims priority under 35 U.S.C. § 119(e) to U.S. Provisional Patent Application Ser. No. 62/543,112, "A Method To Achieve Accurate Formal Property Ranking Using On-The-Fly Machine Learning," filed Aug. 9, 2017. The subject matter of all of the foregoing is incorporated herein by reference in its entirety.

BACKGROUND

1. Technical Field

This disclosure relates generally to formal property verification and, more particularly, to predicting hardness of properties in verification.

2. Description of Related Art

In formal verification, a formal verification tool attempts to solve a set of properties, such as System Verilog assertions (SVAs). These properties are either automatically generated by the tool, manually specified by the tool user, or provided in some other way. Given a fixed computational resource budget (e.g., CPU time, memory, number of available machines), the formal verification tool's performance may be measured by the number of properties solved within the resource budget. Properties not solved at the end of the execution will have a timed out status.

To maximize the tool's throughput, it is advantageous to schedule the properties such that easier properties are solved first and harder properties are solved later. However, the "hardness" of each property is not known with certainty until the tool actually solves the property. It is a challenging problem to estimate the hardness of properties without actually solving the property.

One method of estimating the hardness of properties is to calculate the theoretical upper bound of the formal property, which gives an estimate of the hardness of the property. If there are m variables in the cone-of-influence (COI) logic of the property, the upper bound approach estimates the CPU time to solve the property is in $O(2^m)$, using big-O notation. In a standard test case, a typical property can have 50,000 variables or more. The value of $O(2^{50000})$ is a huge number. However, modern formal tools can often solve many properties within minutes or hours. The theoretical upper bound often is not useful in practice.

Another method of estimating hardness uses ad-hoc heuristics. These are typically in the form of handcrafted formula based on a few feature variables, e.g., the number of input variables, the number of sequential state variables in the COI of the property. In these approaches, the hardness of the property is modeled by some linear or non-linear function, often created by a domain expert. Parameters in these functions are fitted to the given data set using regression techniques. Essentially, these approaches use linear regression techniques to approximate the hardness of a property.

There are at least two major drawbacks with these ad-hoc heuristics. The first drawback is caused by "the limited feature set." These formulas are hand-crafted by a domain expert and typically only involve just a small number (<10) of feature variables, since formal properties with a large number of variables are difficult for a human being to comprehend. The second drawback is caused by "the absolute objective function." These approaches try to estimate the hardness of a property directly. That is, they try to predict the actual CPU time required to solve a property. This is a highly non-linear objective function and difficult to model with standard regression techniques. In practice, these heuristics often give low prediction accuracy on new examples.

Another approach uses machine learning to estimate the hardness of properties. A machine learning model is trained on a training set of other properties from designs of other integrated circuits. The trained model then predicts the hardness of solving properties in new designs. However, if the training set is not representative of the new design or if the new design presents new scenarios, the predicted hardness may also have low accuracy.

SUMMARY

In one aspect, a machine learning model predicts the hardness of unsolved properties, but the machine learning model is trained at runtime with incremental fine-tuning as the formal verification progresses. For example, the machine learning model may predict the relative hardness of pairs of properties—i.e., which property in the pair is harder to solve. These hardness predictions may then be used to formulate a priority order for a formal verification process to attempt to solve the unsolved properties. As the formal verification process progresses, it generates results. For example, certain properties may be solved. These results are used to update a training set, which is used to further train the machine learning model. In this way, the model learns the characteristics of the design undergoing verification.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary embodiments. In the interest of not obscuring the presentation of embodiments of the claimed inventions, in the following Detailed Description, some processing steps or operations that are known in the art may have been combined together for presentation and for illustration purposes and in some instances may have not been described in detail. However, a person skilled in the art will recognize that these embodiments may be used in commerce without these specific details or with equivalents thereof In other instances, well-known processes and devices are not described in detail as not to unnecessarily obscure aspects of these embodiments. In other instances, some processing steps or operations that are known in the art may not be described at all. The following description is instead focused on the distinctive features or elements of various embodiments of the claimed inventions. Furthermore, while this description may refer to some components of the structure in the singular tense, more than one component may be depicted throughout the figures and like components are labeled with like numerals.

Figure 2:
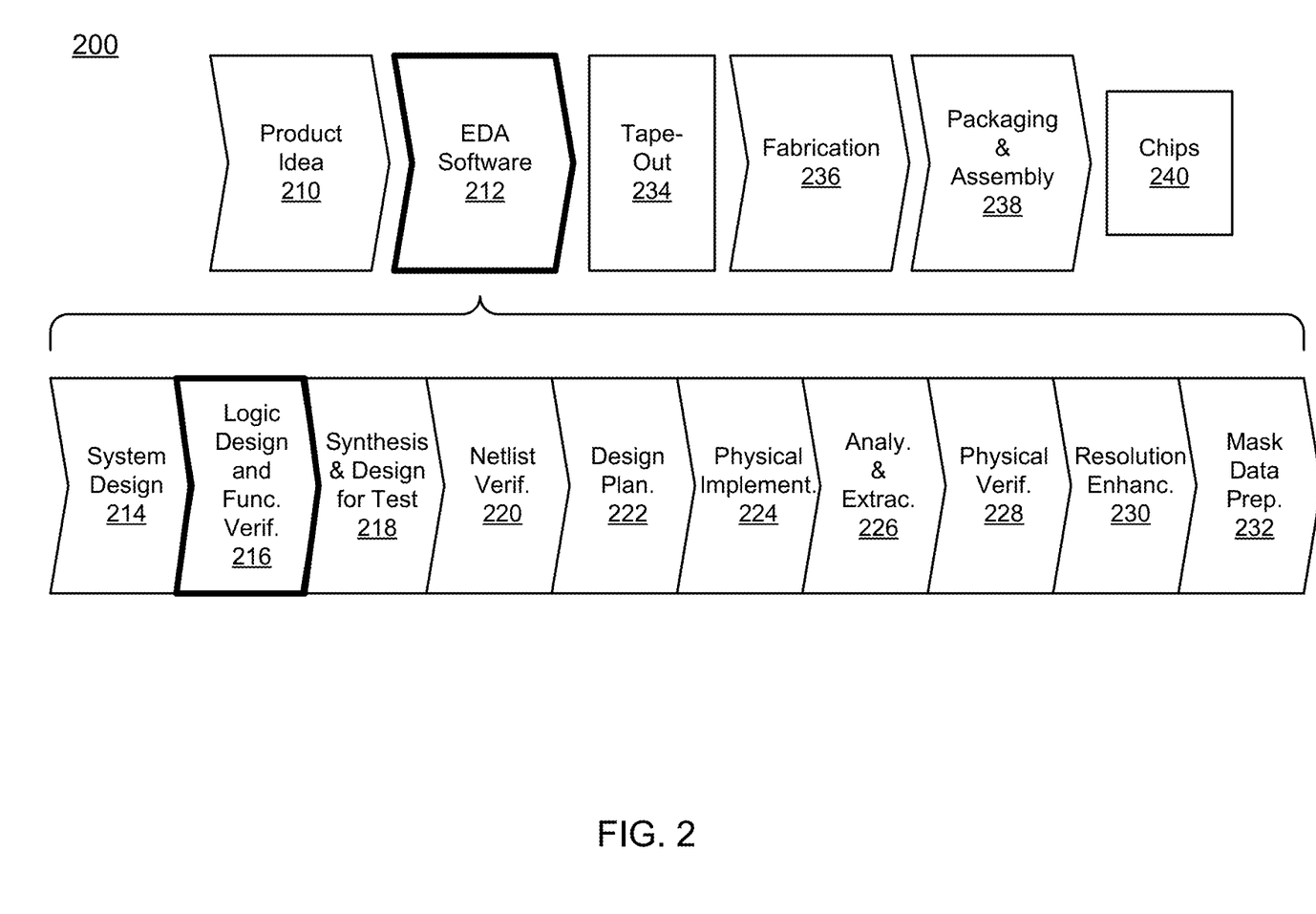
FIG. 2 is a flow diagram illustrating various operations in the design and fabrication of an integrated circuit.

Embodiments of the present disclosure can be used during one or more of the EDA stages described in FIG. 2. Specifically, some embodiments of the present disclosure can be used in EDA software 212 as a part of logic design and functional verification 216.

One type of functional verification 216 is formal verification. In formal verification, the functionality of a design of an integrated circuit is tested or verified using formal proofs. The formal verification environment includes a number of properties and constraints. Known methods are used to prove or disprove the properties, subject to the given constraints, thus indicating whether the circuit design has the correct functionality.

In one embodiment, the integrated circuit design undergoing verification is a register transfer level (RTL) design. The properties are assertions that document the functionality of the design, verify that the intent of the design is met over the simulation period or exclusive functional verification, and/or determine whether the design is functionally correct according to its specification. The properties may be SystemVerilog assertions. They also may be assertions generated and/or extracted automatically by formal verification tools. Assertion-based verification improves the quality of the design and reduces the design cycle.

However, a complex design with a large number of properties may take too long to fully verify all properties. In addition, the amount of runtime or other compute resources required to solve a property (i.e., to prove or falsify the property) can vary significantly depending on the property and on the circuit design. When solving a set of properties, it is often desirable to solve the easier properties first, but it may be difficult to know which properties are the easier properties. Hardness, in this context, refers to the difficulty of solving a property. Solving easier properties first increases the throughput, which helps to catch design issues faster, fix them sooner, and improve overall turnaround time of circuit design.

In formal verification tools, properties are checked by the tool to see if they are proven to be true, or falsified with a counter example trace (waveform). Properties may also have a timed-out or inconclusive result if the tool runs out of computational time/memory during the check. In theory, the hardness of a formal property has exponential time upper bound with respect to the number variables in the cone-of-influence (COI) logic of the properties. In practice, the hardness of a formal property may be measured by the lowest CPU time required by a formal verification tool to actually solve the property, concluding with either proven or falsified status.

Figure 1:
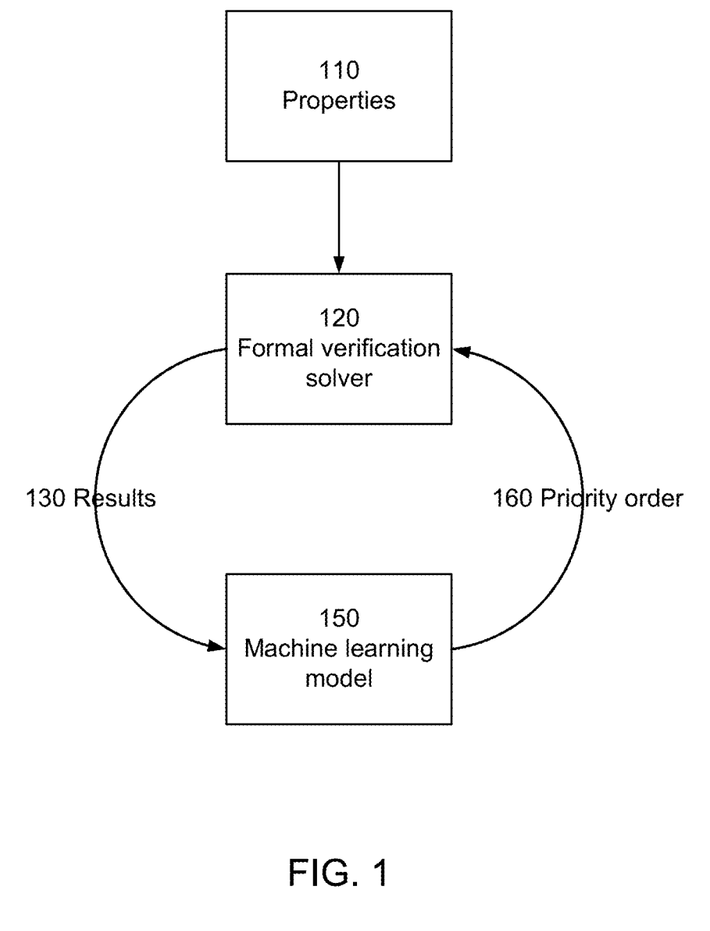
FIG. 1 is a flow diagram for ordering properties according to hardness estimated by a machine learning model, according to an embodiment.

FIG. 1 is a flow diagram for ordering properties according to hardness estimated by a machine learning model, according to an embodiment. In FIG. 1, a machine learning model predicts the hardness of unsolved properties. For example, the machine learning model may predict the relative hardness of pairs of properties—i.e., which property in the pair is harder to solve. These hardness predictions may then be used to formulate a priority order for the formal verification process to attempt to solve the unsolved properties. In one approach, the formal verification process attempts to solve the easier properties first.

In FIG. 1, a formal verification system 120 attempts to solve a set of properties 110. Results 130 are generated as execution of the formal verification process progresses. For example, certain properties 110 may be solved. These results are used to update a training set, which is used to further train a machine learning model 150. The machine learning model 150 predicts the hardness of unsolved properties. A priority order 160 for solving the properties is formulated based on the predicted hardness. The formal verification process continues execution using the updated priority order.

In FIG. 1, the machine learning model 150 is trained at runtime with incremental fine-tuning as the formal verification process 120 progresses. In this example, fine-tuning the machine learning model 150 improves the accuracy of the hardness predictions for properties, which may then be used for scheduling 160 easier properties before harder ones. The machine learning model 150 is refined on-the-fly as the formal verification process 120 solves more difficult properties to enable more precise prediction as the verification proceeds.

Machine learning models for the design may be stored and then later retrieved and used for future runs, especially formal verification processes for later versions of the same circuit design.

Because this approach trains the machine learning model on results of formal verification for the specific design under verification, the resulting machine learning model may train faster and with a smaller training set, and may provide more accurate predictions. This is particularly true if the design under verification has unique features or characteristics which may not appear in a more generic training set based on other circuit designs. The machine learning model is trained to be an expert in a particular design or design family. In addition, as the on-the-fly training progresses, the dynamic machine learning model should improve as it learns more about the design being verified. The on-the-fly machine learning flow may also be adaptive to changes in formal verification tools. Changes in the formal verification tools may change the hardness calculation, which will be learned by the machine learning model over time as new results are produced and incorporated into the training set.

FIG. 2 illustrates various processes performed in the design and fabrication of an integrated circuit using software tools with a computer to transform data and instructions that represent the integrated circuit. The process shown in FIG. 1 may be used in the process of FIG. 2. These processes start with the generation of a product idea 210 with information supplied by a designer and is realized during a design process that uses EDA software tools 212, which may also be signified herein as EDA software, as a design tool or a verification tool. When the design is finalized, it can be taped-out 234. After tape-out, a semiconductor die is fabricated 236 and packaging and assembly processes 238 are performed, which result in the finished integrated circuit 240 which may also be signified herein as a circuit, device, component, chip or SoC (system on chip).

Note that the design process that uses EDA software tools 212 includes operations 214-232, which are described below. This design flow description is for illustration purposes only and is not meant to limit the present disclosure. For example, an actual integrated circuit design may require a designer to perform the design operations in a different sequence than the sequence described herein.

During system design 214, a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products.

Then, during logic design and functional verification 216, VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test 218, VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification 220, the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning 222, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation 224, the placement positioning of circuit elements such as transistors or capacitors and routing connection of the same by a plurality of conductors occurs. Exemplary EDA software products from Synopsys, Inc. of Mountain View, Calif. that can be used at this stage include: the Astro and IC Compiler products.

Then, during analysis and extraction 226, the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification 228, the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement 230, geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation 232, the 'tape-out' data for production of masks to produce finished integrated circuits is provided. Exemplary EDA software products from Synopsys, Inc. of Mountain View, Calif. that can be used at this stage include the Cats. family of products.

For all of the above mentioned integrated circuit design tools, similar tools from other EDA vendors, such as Cadence and Mentor Graphics, can be used as an alternative. Additionally, similarly non-commercial tools available from universities can be used.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Figure 3:
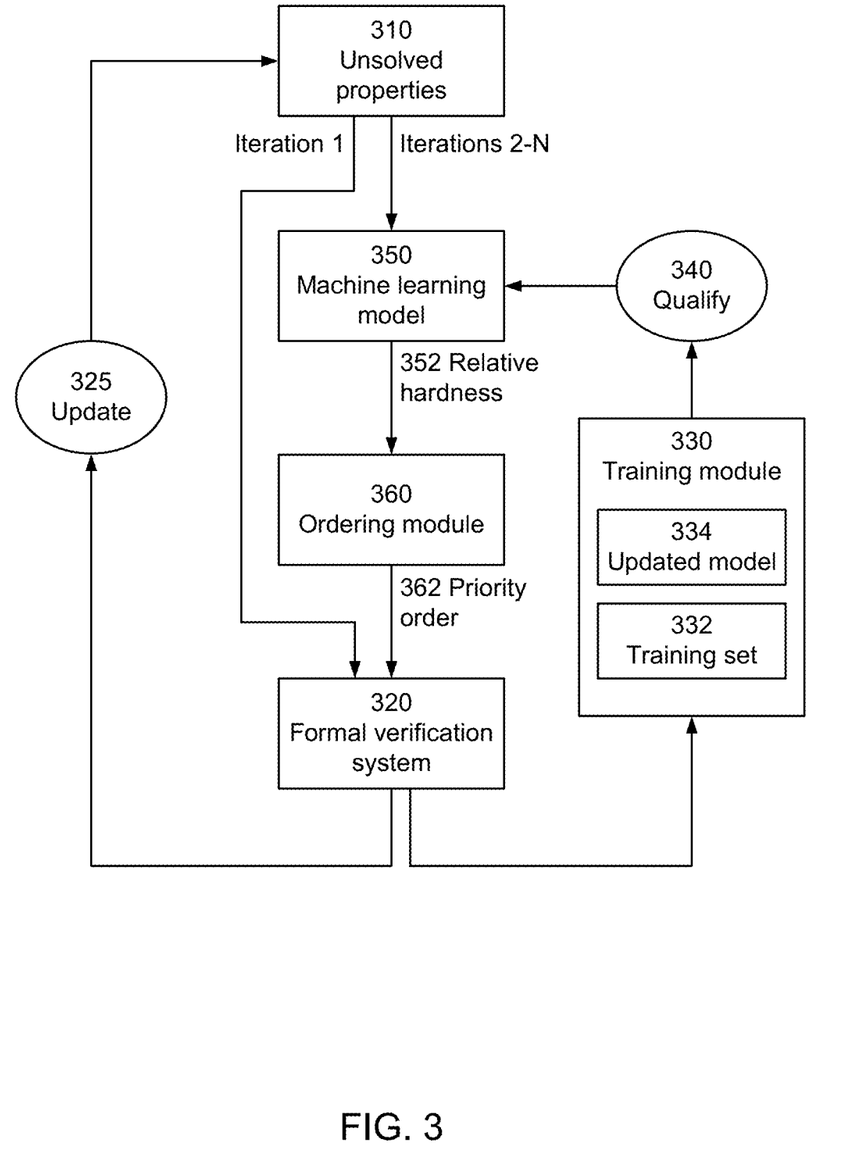
FIG. 3 is a more detailed flow diagram for ordering properties according to hardness estimated by a machine learning model, according to an embodiment.

FIG. 3 is a more detailed flow diagram for ordering properties according to hardness estimated by a machine learning model, according to an embodiment. In FIG. 3, a machine learning model predicts the hardness of unsolved properties. The machine learning model is trained and refined on-the-fly and incrementally, using verification results from the design undergoing verification. That is, the machine learning model is adjusted continuously as the formal verification process progresses. As a result, it becomes better adapted to the design under verification. In order to prevent overfitting, a qualification step is performed to compare the updated model and the current model to determine which model will be used. Formal orchestration typically runs in a round-robin loop with increasing resource budget. This example uses runtime, but other resources could also be used.

FIG. 3 demonstrates the details in each iteration. Suppose that the formal verification process is divided into iterations, where the runtime slice of each iteration is t1, t2, t3, . . . (t1 <t2 <t3 <. . . ), respectively.

Iteration 1: In this example, the first iteration is an initial phase during which the hardness estimates from the machine learning model 350 are not used. For example, the machine learning model may not yet be sufficiently trained. This initial phase continues for a predetermined runtime t1. Because this is the first iteration, every property in the set is unsolved. The set of unsolved properties 310 is ordered but not by the machine learning model. For example, round-robin ordering may be used. The formal verification system 320 attempts to solve each property 310. Solved properties are removed 325 from the list of unsolved properties.

The results of this iteration are also collected to construct an initial training set 330. The samples in the training set typically include features extracted from each property (e.g., features extracted from the COI logic for the property) and the runtime and the result (e.g., whether the property is solved) for each property. The training set 330 is used to initiate and train the machine learning model 350. In this first iteration, qualification 345 may be skipped. This machine learning model predicts the hardness of properties. The initial version of the machine learning model (i.e., the model before training) may be a model with randomized weights. Alternatively, it may be a machine learning model that was previously trained on results of a formal verification process for designs of other integrated circuits.

Iterations 2-N. In subsequent iterations, the machine learning model 350 is used to predict the hardness 352 of the unsolved properties 310. In this example, the machine learning model 350 predicts relative hardness 352 between pairs of properties. Based on the predicted hardness 352, an ordering module 360 orders the unsolved properties. Typically, priority is given to properties that are less hard to solve. The formal verification process 320 attempts to solve the properties, following the priority order 362. Solved properties are removed 325 from the list of unsolved properties.

The results of this iteration are also collected and used by a training module 330 to further train the machine learning model. The results are used to update the training set 332. For example, if the formal verification system solves one of the previously unsolved properties, the training set 332 may be updated to include training samples that indicate that the now-solved property is less hard than the remaining unsolved properties. The updates to the training set 332 are used to further train 334 the machine learning model. In FIG. 3, the updated machine learning model 334 is first qualified 340 before it replaces the current machine learning model 350. In the qualification step 340, a subset of the solved properties were not used for training and are now tested using the updated machine learning model 334. The results can indicate whether the updated model 334 has been overtrained (i.e., overfitting to the data in the training set). Based on the qualification process, either the updated model 334 or the original model 350 will be used to predict hardness going forward. The loop in FIG. 3 continues until it exceeds a global timeout limit or until all the properties are solved.

In this example, only results for the design undergoing verification are used to train the machine learning model (other than the initial version of the model). The training set does not include results from formal verification of designs of other integrated circuits. Because the training set is highly matched to the prediction tasks, not many training samples are required to achieve good performance. For example, the machine learning model may be used to predict hardness after it has been trained on less than 100 properties or even on less than 50 properties. This is because the properties used for training are from the design undergoing verification so they provide a highly relevant training set.

In addition, in this example, the machine learning model is updated at most once per iteration, for example based on the properties that were solved during the iteration. Alternatively, the machine learning model may be continually trained and updated as additional training data becomes available.

Figure 4A:
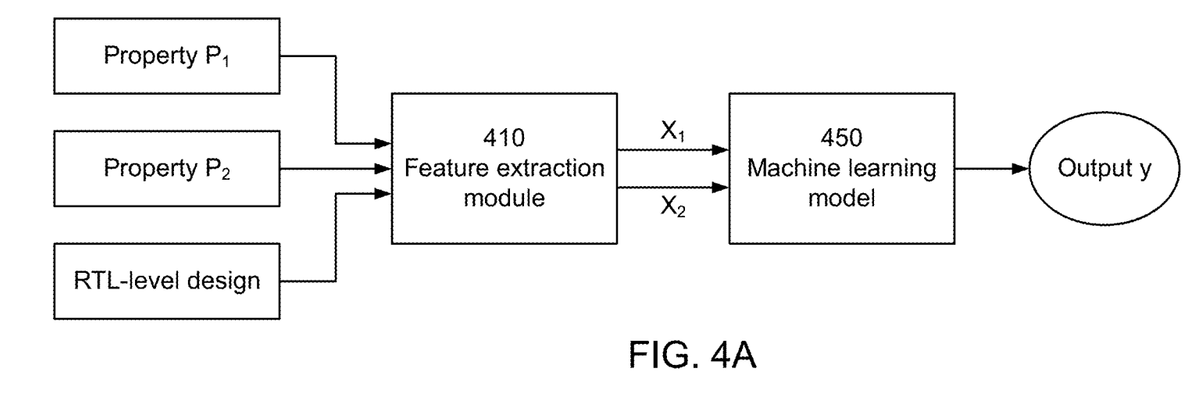
FIGS. 4A and 4B are flow diagrams for inference by a machine learning model and training of a machine learning model, respectively, according to an embodiment.
Figure 4B:
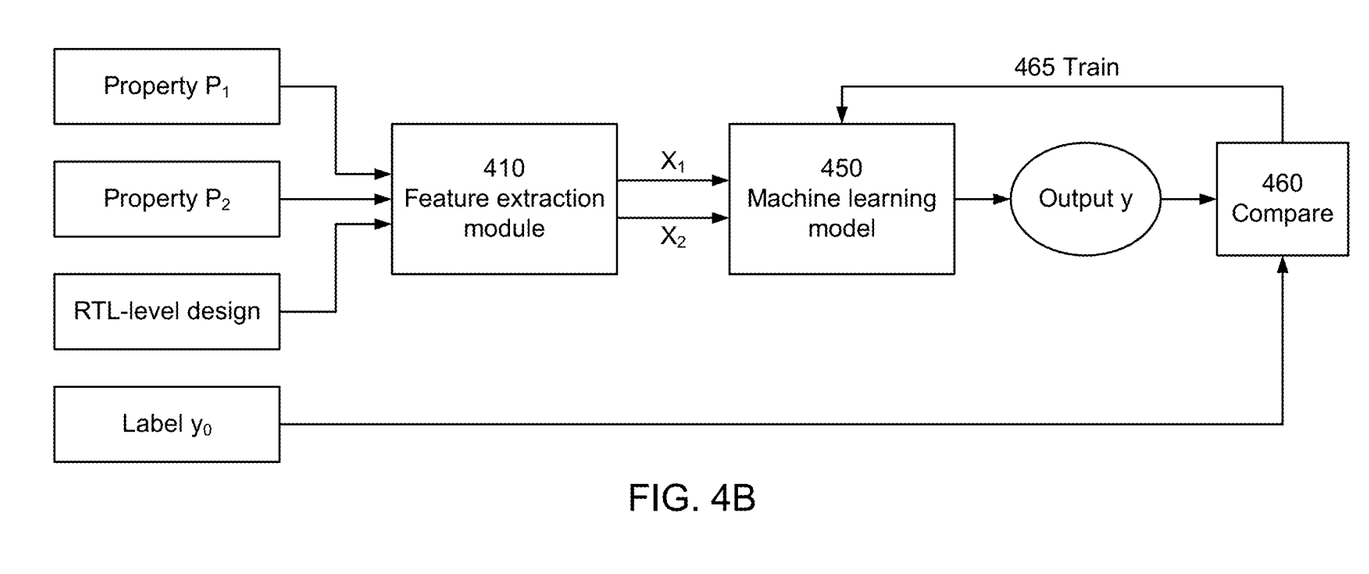

FIGS. 4A and 4B are flow diagrams for inference by a machine learning model and training of a machine learning model, respectively, according to an embodiment. In inference (e.g., step 350 in FIG. 3), the trained machine learning model predicts a relative hardness of a pair of properties. The inputs for the flow include the pair of properties $P_1$ and $P_2$ to be compared and the relevant parts of the circuit design (RTL-level design in this example). Feature data $X_j$ are extracted 410 from the properties and the RTL-level design. Instead of utilizing an absolute hardness model, in one embodiment, the machine learning model implements a pair-wise hardness comparison $y=f(X_1,X_2)$. This function compares the hardness of the two properties represented by the corresponding features $X_1$ and $X_2$. The output y of this function represents the relative hardness of the two properties. For example, y may be a non-binary variable in the range of [0,1], representing the probability that property $P_1$ is harder to solve than property $P_2$.

Compared to handcrafted approaches that consider only a handful of features (typically <10), the machine learning approach is scalable in terms of number of features that can be analyzed and utilized. It allows the system to use a significant portion or even all of the feature data that may correlate to a property's hardness. In the training data, in one embodiment, for each formal backend engine/algorithm, the internal engine data that correlates to the engine's runtime is collected. In one experiment, over 300 features were collected. Not-needed, irrelevant, duplicate, and redundant features which do not improve the accuracy of the model may be removed. Various feature selection algorithms (e.g., recursive feature elimination and feature importance ranking) may be applied for dimensionality reduction, to improve prediction accuracy. The removal of such data can also boost the performance by reducing the complexity of the model.

Figure 5:
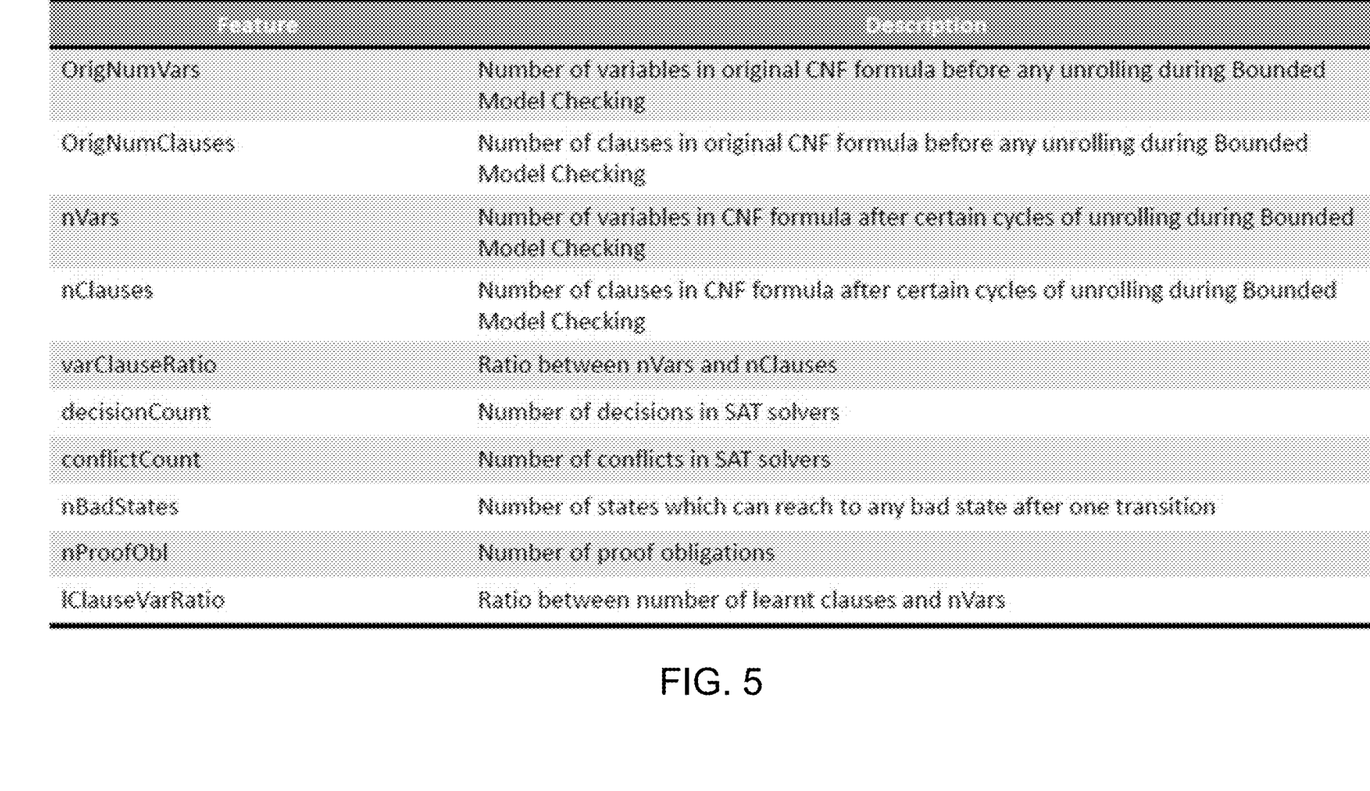
FIG. 5 is a list of features used as inputs to a machine learning model, according to an embodiment.

In one embodiment, the features are different parameters that are computed during property solving. In one embodiment, these parameters may be internal to the formal verification tool. FIG. 5 illustrates a set of exemplary features that may be used in the system. These features may include the number of variables (before and after unrolling), number of clauses (before and after unrolling). The features may also include the ratio between the variables and clauses, as well as ratios between other elements such as a ratio between the learned clauses and the number of variables. In one embodiment, the features may include the number of decisions and conflicts in the satisfiability (SAT) solvers. Other features may be more complex, such as the number of states which can reach a bad state after one transition, or the number of proof obligations. In addition, certain features may be extracted from the COI logic for the property. For a comparative analysis, the features used by the machine learning model may include differences in the features for the two properties being compared.

FIG. 4B shows training of the machine learning model 450 (e.g., step 330 in FIG. 3). In training, the relative hardness $y_0$ of the two properties $P_1$ and $P_2$ is known. For example, the two properties $P_1$ and $P_2$ are already solved. The machine learning model 450 predicts a relative hardness y. This is compared 460 to the ground truth relative hardness $y_0$ and used as feedback 465 to train the machine learning model 450. The ground truth may be referred to as a label. In one approach, the ground truth $y_0$ is a binary variable, since it is known which of $P_1$ and $P_2$ is harder. In an alternative approach, the ground truth is a non-binary variable that is an indicator of the relative hardness of the two properties. For example, $y_0 \approx 0.5$ for two properties that have approximately the same runtime, and $y_0 \approx 0$ or 1 for two properties that have very different runtimes.

Figure 6:
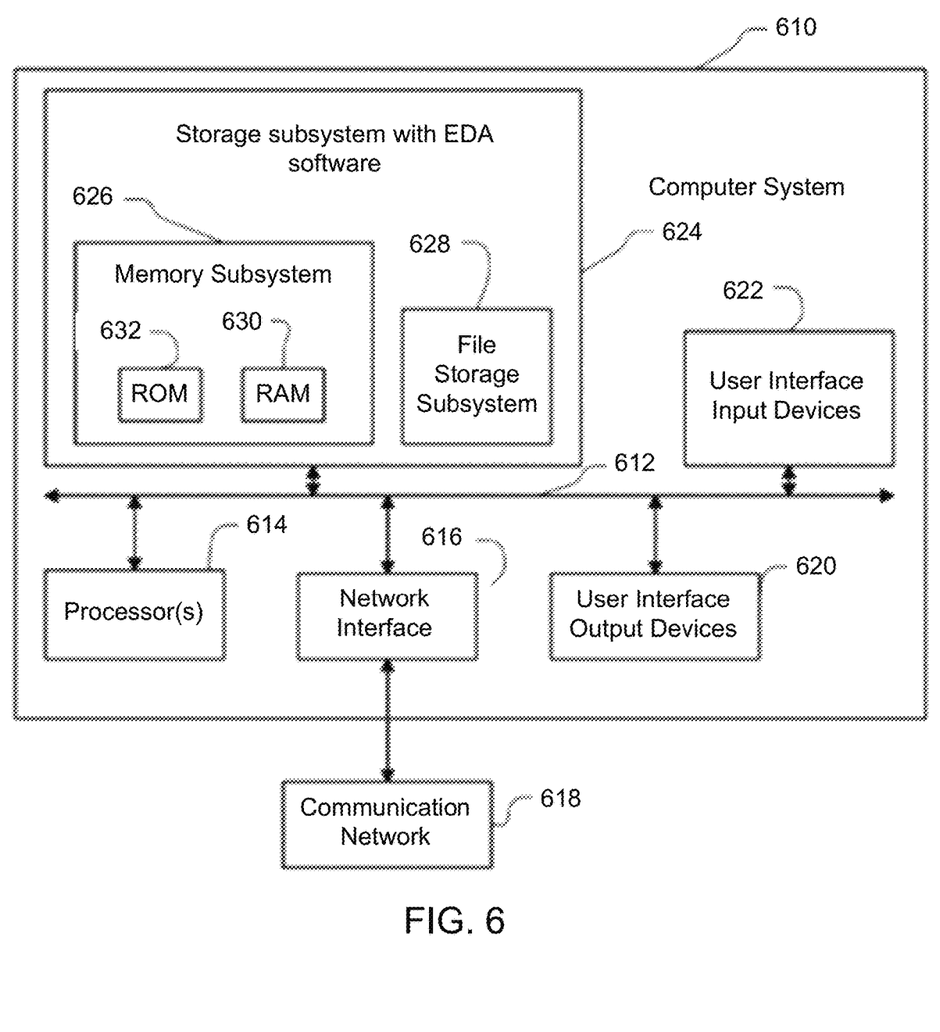
FIG. 6 is a block diagram of one embodiment of a computer system that may be used with the present invention.

FIG. 6 is a block diagram of one embodiment of a computer system 610 that may be used with the present invention. The computer system 610 typically includes at least one computer or processor 614 which communicates with a number of peripheral devices via bus subsystem 612. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms "processor" and "computer" are further defined below. These peripheral devices may include a storage subsystem 624, comprising a memory subsystem 626 and a file storage subsystem 628, user interface input devices 622, user interface output devices 620, and a network interface subsystem 616. The input and output devices allow user interaction with computer system 610.

The computer system may be a server computer, a client computer, a workstation, a mainframe, a personal computer (PC), a tablet PC, a rack-mounted "blade" or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term "processor" here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the operations discussed herein. Due to the ever-changing nature of computers and networks, the description of computer system 610 depicted in FIG. 6 is intended only as one example for purposes of illustrating the preferred embodiments. Many other configurations of computer system 610 are possible having more or less components than the computer system depicted in FIG. 6.

Network interface subsystem 616 provides an interface to outside networks, including an interface to communication network 618, and is coupled via communication network 618 to corresponding interface devices in other computer systems or machines. Communication network 618 may comprise many interconnected computer systems, machines and communication links. These communication links may be wireline links, optical links, wireless links, or any other devices for communication of information. Communication network 618 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 622 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 610 or onto communication network 618. User interface input devices typically allow a user to select objects, icons, text and the like that appear on some types of user interface output devices, for example, a display subsystem.

User interface output devices 620 may include a display subsystem, a printer, or non-visual displays such as audio output devices. The display subsystem may include a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 610 to the user or to another machine or computer system.

Memory subsystem 626 typically includes a number of memories including a main random-access memory (RAM) 630 (or other volatile storage device) for storage of instructions and data during program execution and a read only memory (ROM) 632 in which fixed instructions are stored. File storage subsystem 628 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 628.

Bus subsystem 612 provides a device for letting the various components and subsystems of computer system 610 communicate with each other as intended. Although bus subsystem 612 is shown schematically as a single bus, alternative embodiments of the bus subsystem may use multiple busses. For example, RAM-based main memory can communicate directly with file storage systems using Direct Memory Access (DMA) systems.

As used herein, the term "module" signifies a tangible data and information processing device, that typically is limited in size and/or complexity. For example, the term "module" can signify one or more methods or procedures that can transform data and information. The term "module" can also signify a combination of one or more methods and procedures in a computer program. The term "module" can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as "operations") applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a process comprising a sequence or set of operations or instructions that a module can use to transform data and information to achieve a result. A module can comprise one or more algorithms. As used herein, the term "thread" refers to a sequence of instructions that can comprise a subset of the instructions of an entire process or algorithm. A process or algorithm can be partitioned into multiple threads that can be executed in parallel.

As used herein, the term "computer" includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term "software" or "program" signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A method implemented on a computer system, the computer system executing instructions to effect a method for predicting a hardness of properties to be solved by formal verification, the method comprising:
   executing a formal verification process that attempts to solve each property in a set of properties for a design of an integrated circuit undergoing verification;
   as execution of the formal verification process progresses:
      updating a training set for a machine learning model that predicts a hardness of properties, the update incorporating incremental results of the formal verification process for the design undergoing verification;
      training the machine learning model on the update to the training set;
      using the updated machine learning model to predict the hardness of unsolved properties in the set of properties; and
      formulating a priority order for the formal verification process to attempt to solve the unsolved properties, the priority order based on the predicted hardness.

2. The computer-implemented method of claim 1 wherein the training set includes only results of the formal verification process for the design undergoing verification and does not include results of a formal verification process for designs of other integrated circuits.

3. The computer-implemented method of claim 1 wherein the machine learning model used to predict the hardness of unsolved properties has been trained on results from not more than 100 properties for which the formal verification process has completed.

4. The computer-implemented method of claim 1 wherein inputs to the machine learning model includes features extracted from a cone-of-influence logic for the property for which the machine learning model is predicting hardness.

5. The computer-implemented method of claim 1 wherein, during an initial phase of execution of the formal verification process, the machine learning model is trained based on incremental results from the initial phase but predictions of hardness made by the machine learning model are not used to formulate the priority order for the unsolved properties.

6. The computer-implemented method of claim 5 wherein, during the initial phase, the formal verification process attempts to solve the properties according to a round robin order.

7. The computer-implemented method of claim 1 wherein the formal verification process is executed in runtime slices, and the machine learning model used to predict hardness is updated once per runtime slice based on the results of the formal verification process from that runtime slice.

8. The computer-implemented method of claim 1 wherein the machine learning model used to predict hardness is continually updated as the formal verification process is completed for each property.

9. The computer-implemented method of claim 1 further comprising:
qualifying the updated machine learning model before using the updated machine learning model to predict hardness.

10. The computer-implemented method of claim 9 wherein qualifying the updated machine learning model rejects overtrained machine learning models.

11. The computer-implemented method of claim 1 wherein an initial version of the machine learning model was previously trained on results of a formal verification process for designs of other integrated circuits.

12. The computer-implemented method of claim 1 wherein the machine learning model predicts a relative hardness of a pair of properties.

13. The computer-implemented method of claim 12 wherein inputs to the machine learning model include differences in features extracted from a cone-of-influence logic for each of the pair of properties.

14. The computer-implemented method of claim 12 wherein an output of the machine learning model is a non-binary indicator of the relative hardness of the pair of properties.

15. The computer-implemented method of claim 12 wherein the training set includes a plurality of training samples, each training sample comprising features from a pair of properties and a label that is a binary indicator of which property in the pair is harder.

16. The computer-implemented method of claim 12 wherein the training set includes a plurality of training samples, each training sample comprising features from a pair of properties and a label that is a non-binary indicator of a relative hardness of the pair of properties.

17. The computer-implemented method of claim 12 wherein, when the formal verification process completes for one of the previously unsolved properties, the training set is updated to include training samples that indicate that the now-completed property is less hard than the remaining unsolved properties.

18. The computer-implemented method of claim 1 further comprising:
storing the machine learning model; and
retrieving and using the machine learning model in a formal verification process for a later version of the design for the integrated circuit.

19. The computer-implemented method of claim 1 wherein the design undergoing verification is an RTL-level design.

20. A system comprising:
a memory storing instructions; and
a processor coupled with the memory and to execute the instructions; the instructions when executed cause the processor to:
execute a formal verification that attempts to solve each property in a set of properties for a design of an integrated circuit undergoing verification;
extracts features from the set of properties;
receives, by a machine learning model, the extracted features as input to predict a hardness of the corresponding properties;
formulate a priority order for the formal verification to attempt to solve the unsolved properties, the priority order based on the predicted hardness; and
as execution of the formal verification progresses,
update a training set for the machine learning model, the update incorporating incremental results produced by the formal verification; and
train the machine learning model on the update to the training set.

\* \* \* \* \*